US008598686B2

(12) United States Patent
Chang et al.

(10) Patent No.: US 8,598,686 B2

(45) Date of Patent: Dec. 3, 2013

(54) ELECTRONIC DEVICE PACKAGE STRUCTURE WITH A HYDROPHILIC PROTECTION LAYER AND METHOD FOR FABRICATING THE SAME

(75) Inventors: Tao-Chih Chang, Taoyuan County (TW); Su-Tsai Lu, Hsinchu (TW); Jing-Yao Chang, Taipei County (TW); Chau-Jie Zhan, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 450 days.

(21) Appl. No.: 12/891,734

(22) Filed: Sep. 27, 2010

(65) Prior Publication Data

US 2011/0227190 A1 Sep. 22, 2011

(30) Foreign Application Priority Data

Mar. 17, 2010 (TW) .............................. 99107774 A

(51) Int. Cl.
*H01L 23/544* (2006.01)

(52) U.S. Cl.
USPC .................... 257/620; 257/506; 257/E23.136

(58) Field of Classification Search
USPC .................................. 257/506, E23.136, 620
See application file for complete search history.

(56) References Cited

U.S. PATENT DOCUMENTS

| | | | | |
|---|---|---|---|---|
| 4,420,767 | A * | 12/1983 | Hodge et al. | 257/713 |
| 6,414,394 | B1 * | 7/2002 | Ito et al. | 257/760 |
| 6,539,625 | B2 | 4/2003 | Engel et al. | |
| 6,707,129 | B2 | 3/2004 | Wang | |
| 7,042,070 | B2 * | 5/2006 | Yew et al. | 257/668 |
| 7,160,756 | B2 | 1/2007 | Kripesh et al. | |
| 2002/0160597 | A1 | 10/2002 | Yang et al. | |
| 2008/0142990 | A1 | 6/2008 | Yu et al. | |
| 2008/0277765 | A1 | 11/2008 | Lane et al. | |
| 2009/0020842 | A1 | 1/2009 | Shiau et al. | |
| 2009/0127710 | A1 | 5/2009 | Daubenspeck et al. | |
| 2009/0152741 | A1 | 6/2009 | Chang et al. | |
| 2009/0278236 | A1 * | 11/2009 | Sato et al. | 257/620 |

FOREIGN PATENT DOCUMENTS

| | | |
|---|---|---|
| CN | 101009266 A | 8/2007 |
| CN | 101641776 A | 2/2010 |
| TW | 407314 | 10/2000 |
| TW | I285419 | 8/2007 |

OTHER PUBLICATIONS

Seung Wook Yoon et al.,"150 µm Pitch Pb-Free Flipchip Packaging with Cu/Low-k Interconnects," Electronic Components and Technology Conference, 2005, 10 pages, IEEE, US.

Piet De Moor et al., "Recent Advances in 3D Integration at IMEC," 2007, vol. 970, Material Research Society, US.

* cited by examiner

*Primary Examiner* — Stephen W Smoot
*Assistant Examiner* — Vicki B Booker

(57) ABSTRACT

The invention provides an electronic device package structure and method of fabrication thereof. The electronic device package structure includes a chip having an active surface and a bottom surface. A dielectric layer is disposed on the active surface of the chip. At least one trench is formed through the dielectric layer. A first protection layer covers the dielectric layer and sidewalls of the trench. A second protection layer covers the first protection layer, filling the trench.

25 Claims, 7 Drawing Sheets

ELECTRONIC DEVICE PACKAGE STRUCTURE WITH A HYDROPHILIC PROTECTION LAYER AND METHOD FOR FABRICATING THE SAME

CROSS REFERENCE TO RELATED APPLICATIONS

This application claims priority of Taiwan Patent Application No. 099107774, filed on Mar. 17, 2010, the entirety of which is incorporated by reference herein.

BACKGROUND

1. Technical Field

The disclosure relates to an electronic device package structure and a method for fabricating the same, and in particular relates to an electronic device package structure with a hydrophilic polymer protection layer and a method for fabricating the same.

2. Technical Art

To continue improvements in mass production of packaged electronic devices, a main manufacturing trend is to utilize low dielectric constant (k) dielectric layers in the interconnection structure of a manufactured chip. By using a low k dielectric layer, parasitical capacitance in the interconnection structure of a manufactured chip may be minimized. Nevertheless, low k dielectric layers have a very low Young's modulus. Also, low k dielectric layers have poor adhesion characteristics and low CTE matching ability with other materials. Additionally, low k dielectric layers are easily damaged due to thermal or mechanical stress. Moreover, low k dielectric layers are easily affected by humidity and temperature and may easily absorb moisture during wet processes such as a through silicon via (TSV) electro plating process. Also, electronic devices with low k dielectric layers may succumb to electromigration degradation due to Joule heating and back stress.

Thus, a novel electronic device package structure and a method for fabricating the same are desired to maintain integrity of low k dielectric layers after a wafer bonding process, comprising a through hole formation process, an electro plating filling process, a thermal bonding process or a wafer cutting process, is performed thereto.

SUMMARY

An embodiment of an electronic device package structure is provided. The electronic device package structure comprises a chip having an active surface and a bottom surface. At least one dielectric layer is disposed on the active surface of the chip. At least one trench is formed through the dielectric layer. A first protection layer covers the dielectric layer and sidewalls of the trench. A second protection layer covers the first protection layer, filling the trench.

Another embodiment of an electronic device package structure comprises a chip having an active surface and a bottom surface. At least one dielectric layer is disposed on the active surface of the chip. At least one trench is formed through the dielectric layer. A hydrophilic polymer first protection layer covers the dielectric layer and sidewalls of the trench.

An embodiment of a method for fabricating an electronic device package structure is provided. The method for fabricating the electronic device package structure comprises providing a wafer having a plurality of chips and a plurality of scribe line regions between the chips, wherein each of the chip has an active surface and a bottom surface. At least one dielectric layer is formed on the active surface of the chip. At least one trench is formed in the dielectric layer, adjacent to the sides of the scribe line regions. A first protection layer is conformably formed covering the dielectric layer and sidewalls of the trench. A second protection layer is formed covering the first protection layer and fills the trench. The wafer is cut along the scribe line regions to divide each packaged chips.

Another embodiment of a method for fabricating an electronic device package structure comprises providing a wafer having a plurality of chips and a plurality of scribe line regions between the chips, wherein each of the chips has an active surface and a bottom surface. At least one dielectric layer is formed on the active surface of the chip. At least one trench is formed in the dielectric layer, adjacent to the sides of the scribe line regions. A hydrophilic polymer first protection layer is conformably formed covering the dielectric layer and sidewalls of the trench. The wafer is cut along the scribe line regions to divide each packaged chips.

Yet another embodiment of an electronic device package structure comprises at least two vertically laminated electronic device packages, which are electrically connected to each other, wherein each of the electronic device packages comprises a chip having an active surface and a bottom surface. A dielectric layer is disposed on the active surface of the chip. At least one trench is formed through the dielectric layer. A first protection layer covers the dielectric layer and sidewalls of the trench. A second protection layer covers the first protection layer, filling the trench.

Still yet another embodiment of an electronic device package structure comprises at least two vertically laminated electronic device packages, which are electrically connected to each other, wherein each of the electronic device packages comprises a chip having an active surface and a bottom surface. At least one dielectric layer is disposed on the active surface of the chip. At least one trench is formed through the dielectric layer. A hydrophilic polymer first protection layer covers the dielectric layer and sidewalls of the trench.

A detailed description is given in the following embodiments with reference to the accompanying drawings.

BRIEF DESCRIPTION OF THE DRAWINGS

The embodiment can be more fully understood by reading the subsequent detailed description and examples with references made to the accompanying drawings, wherein.

DETAILED DESCRIPTION OF THE EMBODIMENTS

Figure 1:
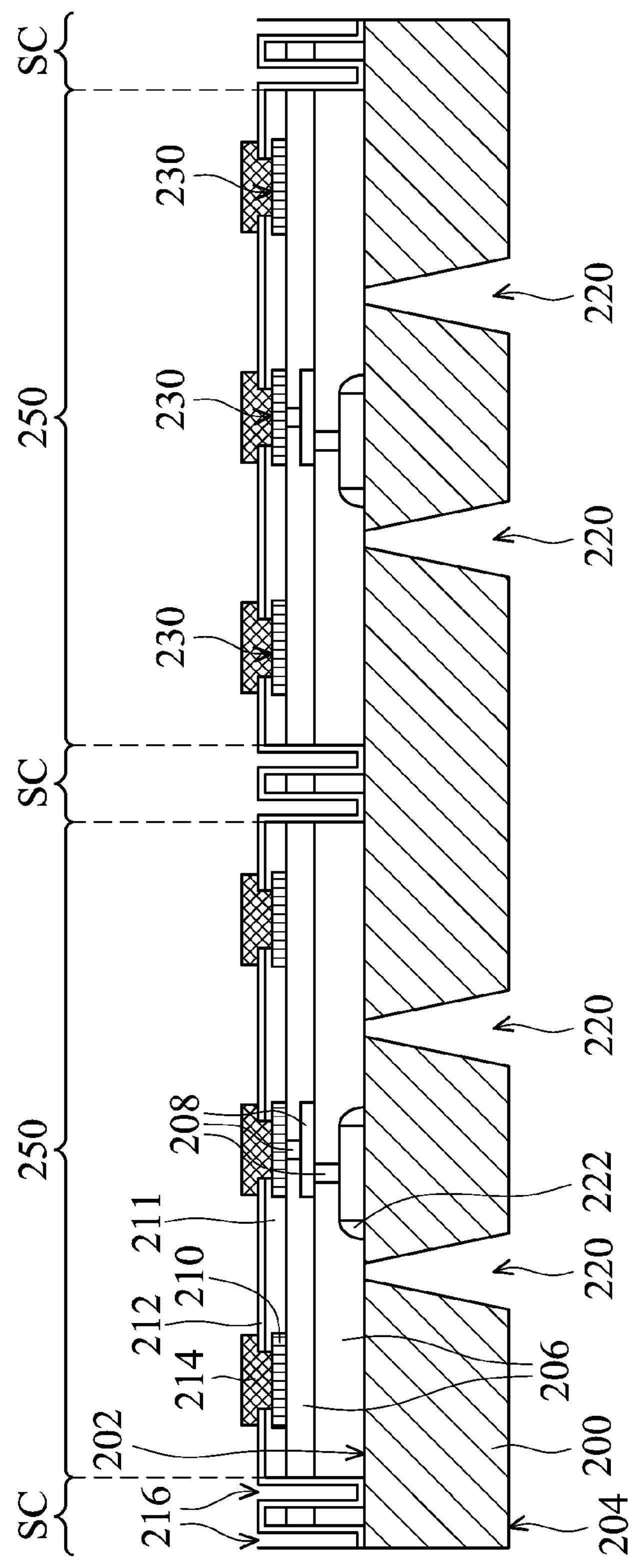
FIGS. 1-4 are cross sections showing the steps for fabricating an electronic device package structure according to an embodiment.

The following description is of the best-contemplated mode of carrying out the embodiment. This description is made for the purpose of illustrating the general principles of the embodiment and should not be taken in a limiting sense. The scope of the embodiment is best determined by reference to the appended claims.

Embodiments provide an electronic device package structure and a method for fabricating the same. The electronic device package structure uses a hydrophilic polymer protection layer with a high mechanical strength coating on sidewalls of through holes and low dielectric constant (low k) dielectric layers. The hydrophilic polymer protection layer may effectively protect the low k dielectric layers from absorbing moisture, during wafer drilling, cutting and bonding processes, to improve the reliability of the electronic device package structure. Additionally, durability of the electronic device package structure may be improved.

FIGS. 1-4 are cross sections showing the steps for fabricating an electronic device package structure 500*a* according to an embodiment. Please refer to FIG. 1, wherein a wafer 200 is provided. The wafer 200 has a plurality of chips 250 and a plurality of scribe line regions SC between the chips 250, wherein the scribe line regions SC are used to separate the chips 250 from each other. Each of the chips 250 has an active surface 202 and a bottom surface 204. Also, at least one electronic device 222 is disposed on the active surface 202. In one embodiment, the wafer 200 may comprise silicon, polymer materials, metal materials or ceramic materials. In one embodiment, the amount of the wafer 200 used is not limited and according to design.

Next, a dielectric layer 206 is formed on the active surface 202 of the chips 250 by deposition methods such as a chemical vapor deposition (CVD) method, a physical vapor deposition (PVD) method comprising sputtering, an atomic layer deposition (ALD) method or a spin coating method. Also, an interconnection structure 208 is formed in the dielectric layer 206, and is electrically connected to the electronic device 222 of the chip 250. In one embodiment, the dielectric layer 206 may comprise a single-layered structure or a multi-layered structure. The dielectric layer 206 may have a dielectric constant (k) which is less than or equal to 3, to serve as a low k dielectric layer 206. For example, the dielectric layer 206 may comprise air, Black Diamond™ (an organic silicate glass provided by Applied Materials.), hydrogen silsesquioxane (HSQ) dielectric materials, methyl silsesquioxane (MSQ) dielectric materials, Coral™ dielectric material (a CVD type low k (k=2.7) carbon doped silicon oxide dielectric material provided by Novellus), and Aurora™ dielectric material (a CVD type low k (k=2.7) carbon doped silicon oxide dielectric material provided by ASM International) or combinations thereof. In one embodiment, the interconnection structure 208 may comprise conductive wires or via plugs formed by Ni, Ag, Al, Cu, W, Ti, Ta, TiN, TaN, nickel silicide, cobalt silicide, or doped polysilicon or combinations thereof.

Next, at least one conductive pad 210 is formed on the dielectric layer 206 by deposition, photolithography and etching processes. The conductive pad 210 is electrically connected to the interconnection structure 208. In one embodiment, the conductive pad 210 may comprise Ni, Ag, Al, Cu, W, Ti, Ta, and doped polysilicon or combinations thereof.

Next, a bottom protection layer 211 is entirely formed covering the dielectric layer 206 by deposition methods such as a chemical vapor deposition (CVD) method, a high density plasma CVD (HDPCVD) method, a physical vapor deposition (PVD) method comprising sputtering or an atomic layer deposition (ALD) method. In one embodiment, the bottom protection layer 211 may comprise silicon nitride, silicon oxide, polyimide, or benzocyclobutene (BCB.™) or combinations thereof.

Next, at least two trenches 216 are formed in the dielectric layer 206 by a photolithography process and a subsequent anisotropic etching process such as a reactive ion etching (RIE) process. Formation positions of the trenches 216 are adjacent to the sides of each of the scribe line regions SC. That is to say, the trenches 216 are respectively adjacent to different edges of each of the chips 250. As shown in FIG. 1, the trenches 216 are respectively adjacent to a right edge and a left edge of each of the chips 250. In one embodiment, bottom portions of the trenches 216 connect to the active surface 202 of the chips 250. Alternatively, the trenches 216 may be formed through the chips 250. In one embodiment, the trenches 216 may have a width between about 2 μm and 100 μm, and the minimum width of the trenches 216 may be about 2 μm.

Next, a first protection layer 212 is conformably formed covering sidewalls of the bottom protection layer 211 and the trenches 216 by an evaporation method. In one embodiment, the first protection layer 212 may be evaporation type hydrophilic polymer materials with a dielectric constant $k \leq 3$. Although the materials of the first protection layer 212 are different from that of the dielectric layer 206, additionally, the first protection layer 212 may have a Young's modulus larger than or equal to 4.5 GPa, and the first protection layer 212 may have a thickness of between about 0.1 μm and 5 μm. For example, the first protection layer 212 may comprise parylene or perfluorinated silane. In one embodiment, the first protection layer 212 is parylene having advantages of having a low dielectric constant ($k<3$), resistance to high temperatures (up to 350° C.), a high step coverage rate, a low moisture vapor transmission rate (MVTR) (e.g. MVTR=0.14 g-mil/100 $in^2$/24 hrs at temperature=37° C. and humidity=90% RH), low mechanical stress, low friction and a high Young's modulus (≥4.5 GPa).

Next, a plurality of openings 230 is formed in the first protection layer 212 and the bottom protection layer 211 by photolithography and etching processes. Therefore, top surfaces of the conductive pads 210 are exposed from the openings 230.

Next, a plurality of under bump metallurgy (UBM) layers 214 is formed filling the openings 230 by deposition, photolithography and etching processes. As shown in FIG. 1, each of the UBM layers 214 electrically connect to the underlying conductive pad 210. In one embodiment, the UBM layer 214 may comprise a Ni/Au layer.

Next, a thinning process may be performed to thin down the wafer 200 from the bottom surface 204. Next, a portion of the wafer material of the wafer 200 is removed by a method such as laser drilling, to form a plurality of openings 220 which extend into the chips 250 from the bottom surface 204.

Figure 2:
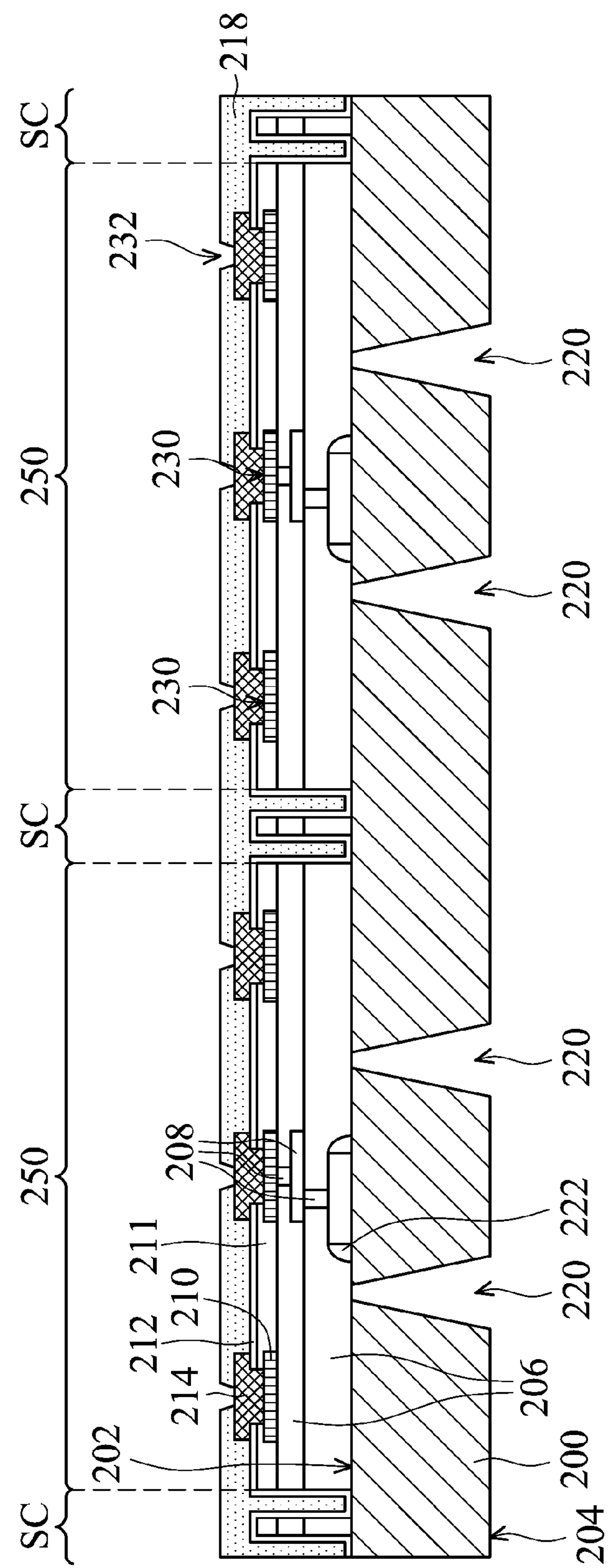

Next, referring to FIG. 2, a second protection layer 218 is formed over the active surface 202 of the chip 250, covering the first protection layer 212 over the dielectric layer 206 and the sidewalls of the trenches 216. Also, the second protection layer 218 fills the trenches 216. The second protection layer 218 may be formed by deposition methods such as a chemical vapor deposition (CVD) method, a high density plasma CVD (HDPCVD) method, a physical vapor deposition (PVD) method comprising sputtering, an atomic layer deposition (ALD) method or a spin coating method. In one embodiment, the second protection layer 218 may have different materials from the first protection layer 212. For example, the second protection layer 218 may comprise underfill materials such as polyimide, epoxy, or ajinomoto build-up (ABF) film or combinations thereof. Next, a plurality of openings 232 is formed in the second protection layer 218 by photolithography and etching processes. Therefore, top surfaces of the UBM layers 214 are exposed from the openings 232.

Figure 3:
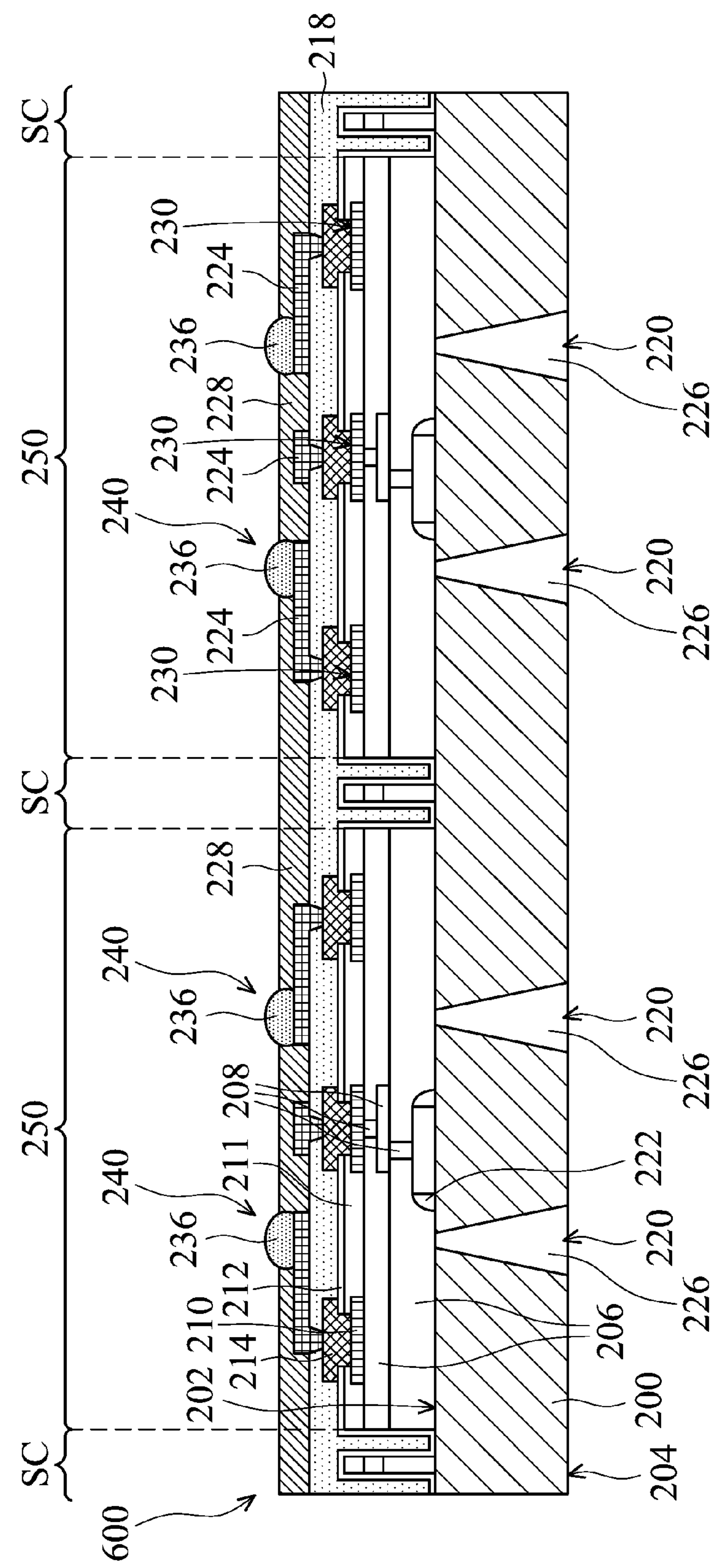

Next, referring to FIG. 3, the openings 232 over the active surface 202 and the openings 220 on the bottom surface 204 of the chip 250 may be filled by a conductive material during an electro plating process. In one embodiment, the conductive material may comprise Ni, Ag, Al, Cu, W, Ti, Ta, or doped polysilicon or combinations thereof. After performing the aforementioned processes, a plurality of redistribution patterns 224 is conformably formed on the second protection layer 218 and in the openings 232 while a plurality of conductive pillars 226 is formed in the openings 220 on the bottom surface 204 of the chip 250. As shown in FIG. 3, the redistribution patterns 224 electrically connect to the conductive pads 210 through the UBM layers 214. Also, the conductive pillars 226 extend into the chip 250 from the bottom surfaces 204 of the chips 250, to electrically connect to the electronic device 222 of the chips 250.

Next, a solder mask layer 228 is formed on the redistribution patterns 224 and the second protection layer 218 by a method such as a solder material coating method. Next, a patterning process is performed on the solder mask layer 228 to form a plurality of openings 240 exposing a portion of the redistribution patterns 224, to define formation positions of the conductive bumps. Next, a solder material is filled into the openings 240 to perform a re-flow process, to form a plurality of conductive bumps 236 such as solder balls. As shown in FIG. 3, the conductive bumps 236 electrically connect to the conductive pads 210 through the redistribution patterns 224 connected thereof and the UBM layers 214. After performing the aforementioned processes, one embodiment of an electronic device package semi-finished structure 600 is formed.

Figure 4:
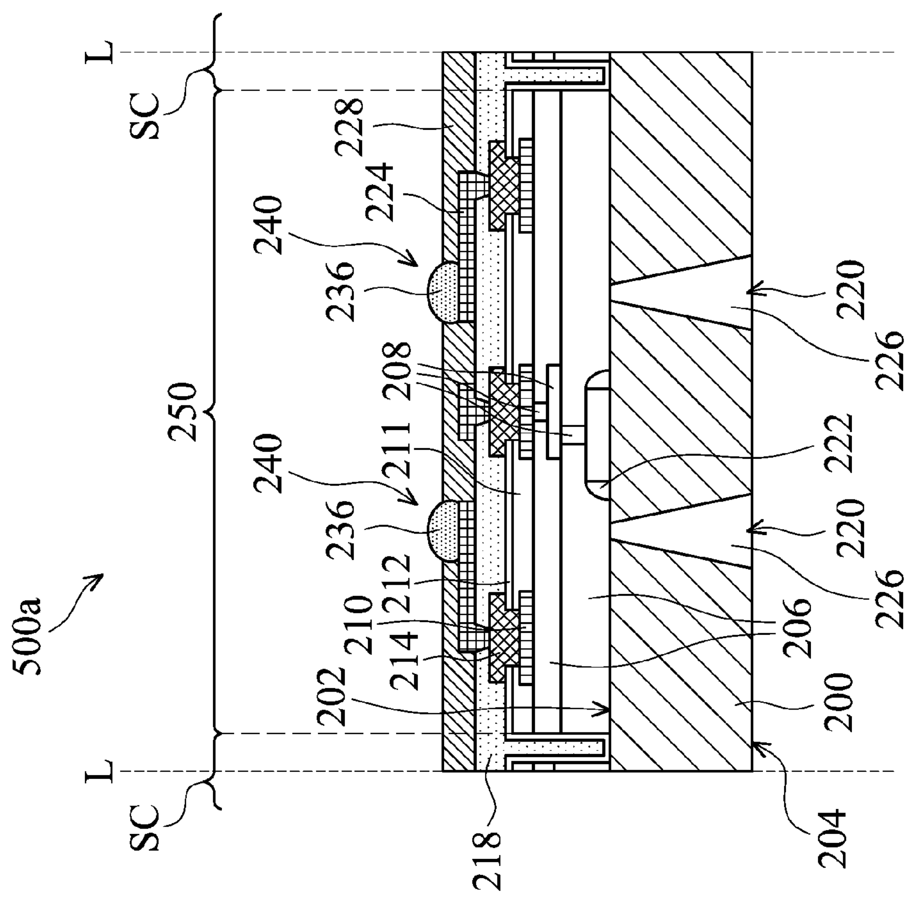

Finally, referring to FIG. 4, the wafer 200 is cut along scribe lines L in the scribe line regions SC and divided into a plurality of packaged chips 250 using a cutting machine. Therefore, forming one embodiment of the electronic device package structure 500*a*.

As shown in FIG. 4, one embodiment of an electronic device package structure 500*a* comprises a chip 250 having an active surface 202 and a bottom surface 204. A dielectric layer 206 is disposed on the active surface 202 of the chip 250. At least one trench 216 is formed through the dielectric layer 206. A first protection layer 212 covers the dielectric layer 206 and sidewalls of the trench 216. A second protection layer 218 covers the first protection layer 212, filling the trench 216, wherein the first protection layer 212 is hydrophilic polymer materials comprising parylene or perfluorinated silane. Also, the first protection layer 212 and the second protection layer 218 have different materials. As shown in FIG. 4, the first protection layer 212 of hydrophilic polymer materials encapsulates the low k dielectric layer 206 and the electric device 222 on the active surface 222 in the electronic device package structure 500*a* from an upper portion of the dielectric layer 206 and the sidewalls of the trenches 216 adjacent to the edges of the chip 250. The first protection layer 212 of hydrophilic polymer materials especially on the sidewalls of the trenches 216 may serve as a sidewall protection structure formed inside of the edges of the package structure. The first protection layer 212 of the hydrophilic polymer materials perform outstandingly when blocking moisture permeating into the package structure from edges thereof. Therefore, when the wafer 200 is cut, moisture does not permeate into the low k dielectric layer 206 from the upper portion and sidewall of the package structure. Thus, decreasing malfunction of the dielectric. Additionally, the first protection layer 212 of hydrophilic polymer materials may also serve as a mechanical stress buffer layer for the electronic device package structure 500*a*. When stress occurs on an interface between the low k dielectric layer 206 and the interconnection structure 208, the interlayer delamination failure problem is eliminated. One embodiment of an electronic device package structure 500*a* with the first protection layer of the hydrophilic polymer materials may maintain integrity of the low k dielectric layer after performing the wafer bonding processes such as the through hole formation process, the electro plating filling process, the thermal bonding process or wafer cutting process.

Figure 5:
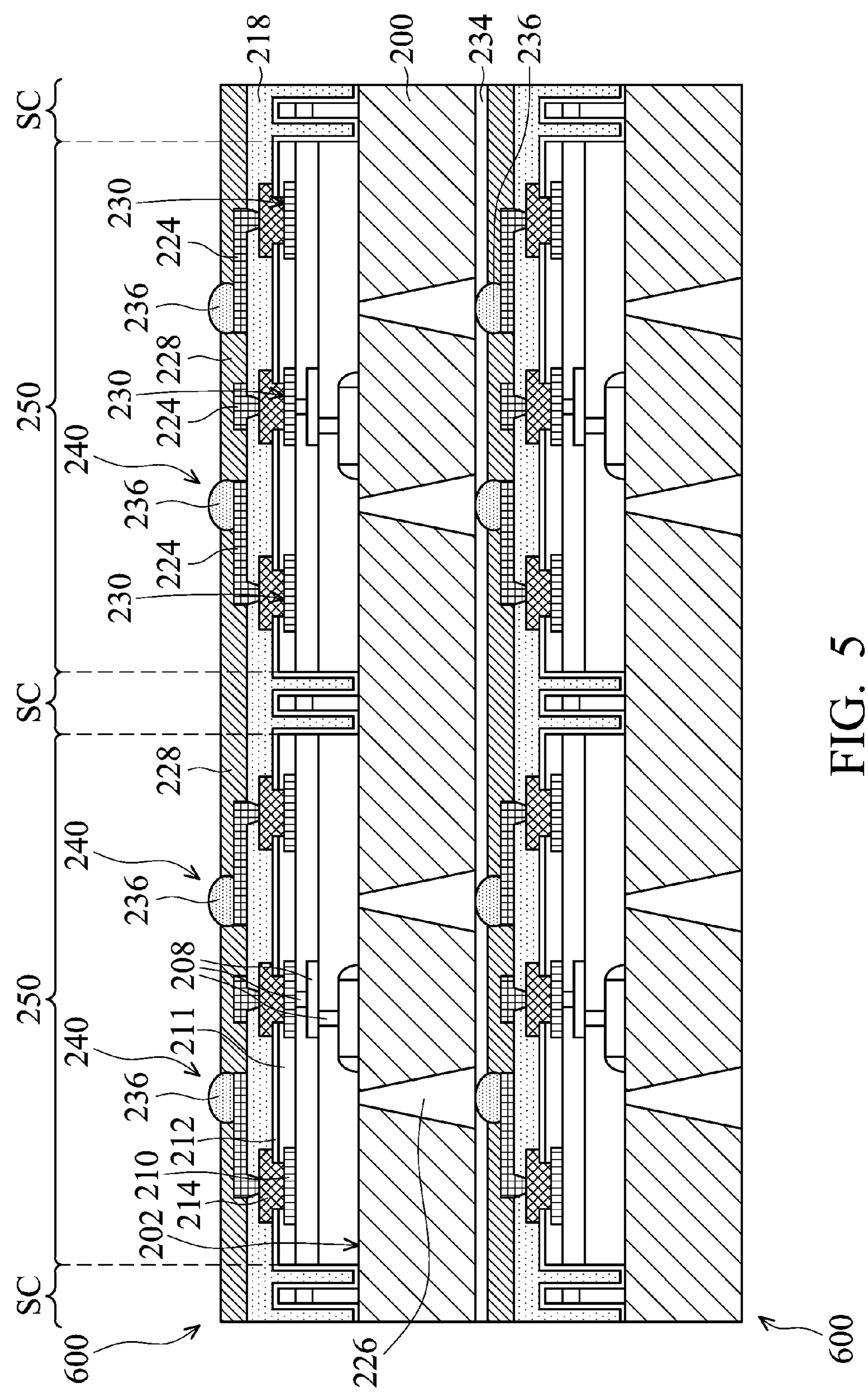
FIGS. 5-7 are cross sections showing the steps for fabricating an electronic device package structure according to another embodiment.
Figure 6:
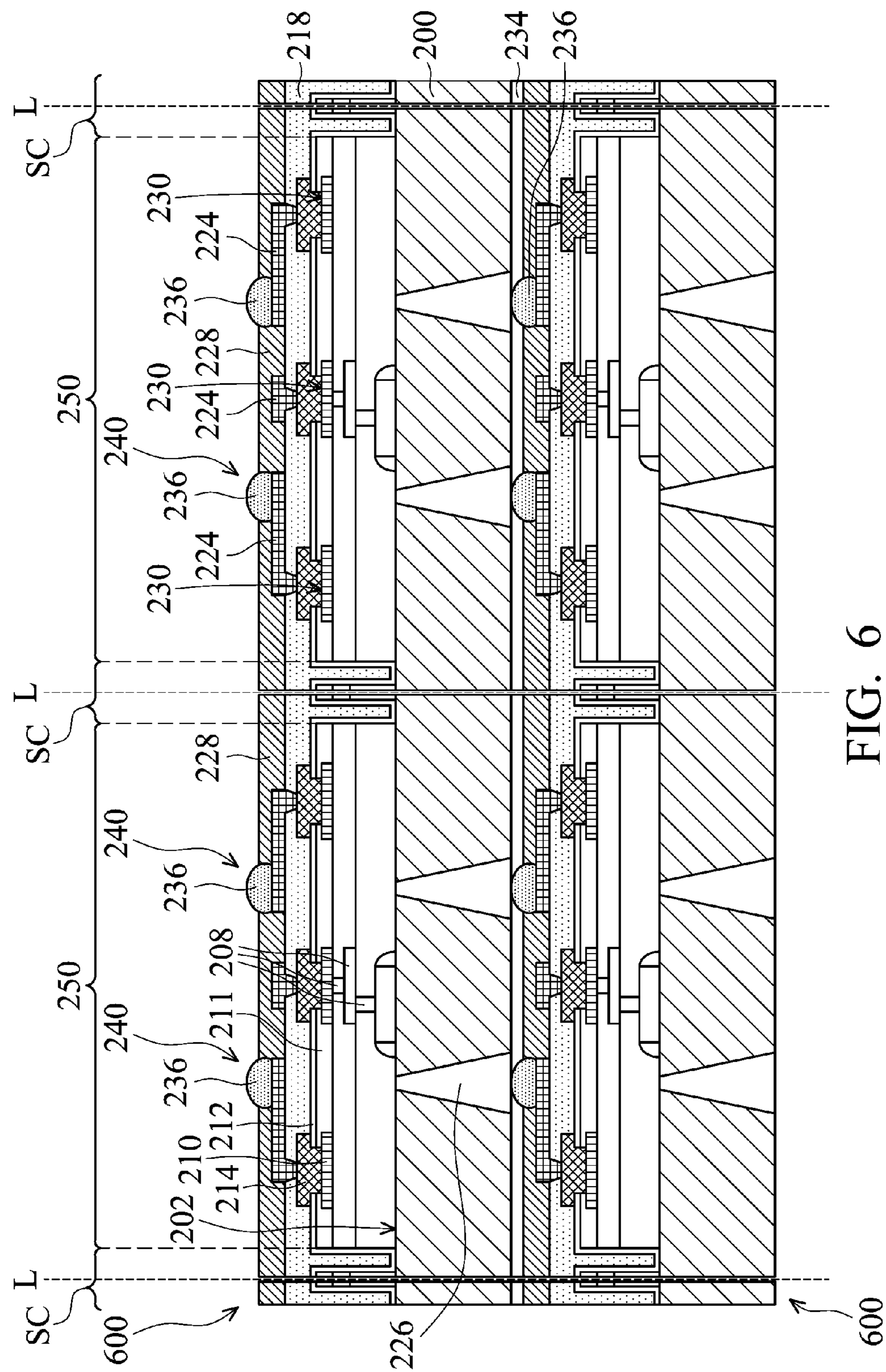
Figure 7:
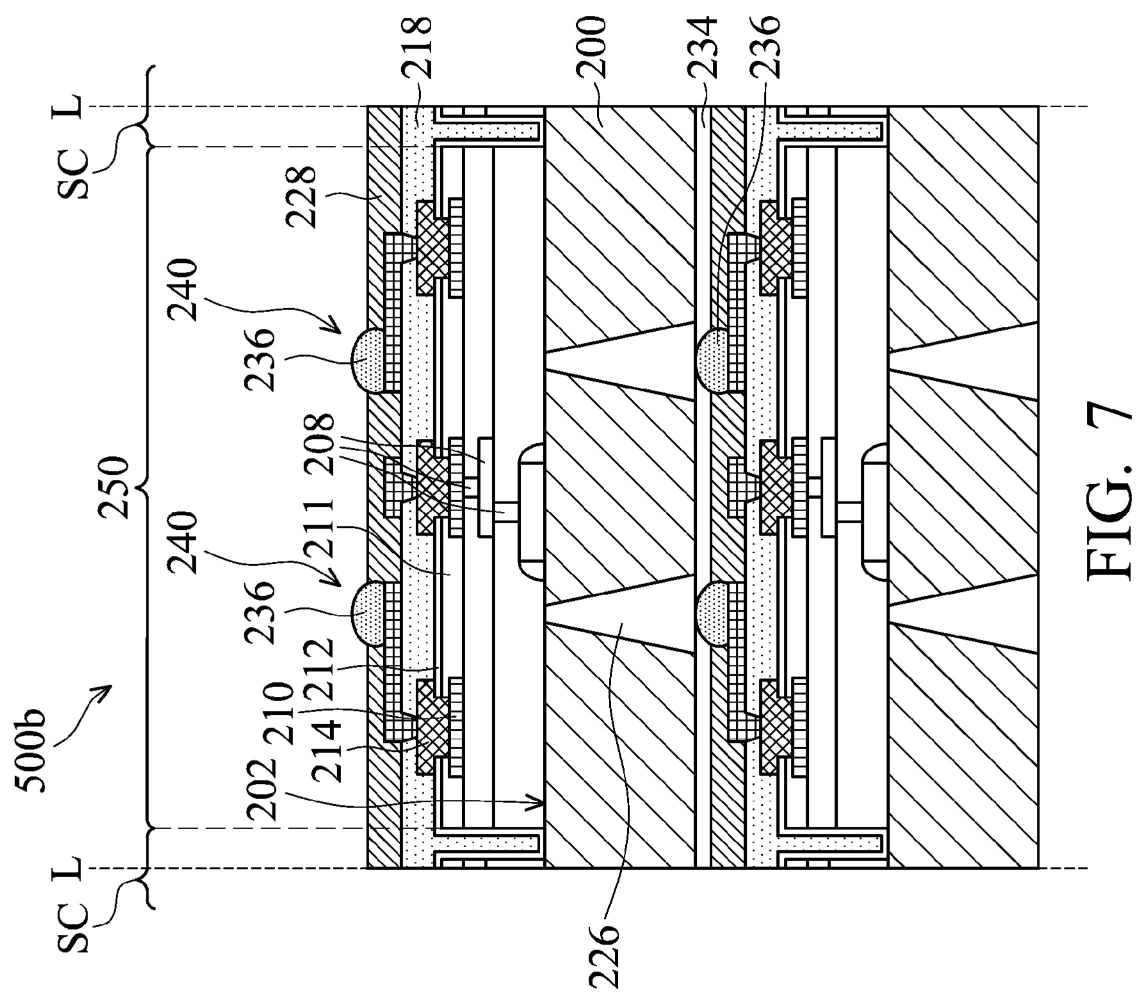

FIGS. 5-7 are cross sections showing the steps for fabricating an electronic device package structure 500*b* according to another embodiment. Elements of the embodiments hereinafter, that are the same or similar as those previously described with reference to FIGS. 1-4, are not repeated for brevity. Please refer to FIG. 5, wherein a filling layer 234 may cover the solder mask layer 228 and the conductive bumps 236 of the electronic device package semi-finished structure 600 as shown in FIG. 3 so that the electronic device package semi-finished structure 600 may vertically laminate another fabricated electronic device package semi-finished structure 600 from a top of the wafer 200 thereof, The conductive bumps 236 of the underlying electronic device package semi-finished structure 600 electrically connect to the conductive pillars 226 of another electronic device package semi-finished structure 600 vertically laminating thereon. In one embodiment, the filling layer 234 may comprise underfill materials such as polyimide, epoxy, or ajinomoto build-up (ABF) film or combinations thereof. In one embodiment, the amount of the laminated electronic device package semi-finished structures 600 is not limited. Two or more than two electronic device package semi-finished structures 600 can be laminated according to requirements.

Finally, referring to FIG. 6, the laminated electronic device package semi-finished structures 600 are cut along scribe lines L in the scribe line regions SC and divided into a plurality of packaged chips 250 using a cutting machine, to form another embodiment of a three-dimensional (3D) electronic device package structure 500*b* as shown in FIG. 7. As shown in FIG. 7, another embodiment of a three-dimensional (3D) electronic device package structure 500*b* may have the advantages of having an electronic device package structure 500*a* with high device density, for achieving requirements of multichip packaging (MCP).

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device package structure, comprising:

a chip having an active surface and a bottom surface;

a dielectric layer disposed on the active surface of the chip;

a first trench formed through the dielectric layer;

a hydrophilic first protection layer which covers the dielectric layer and sidewalls of the first trench, wherein the hydrophilic first protection layer has an opening therethrough;

a second protection layer which covers the first protection layer, filling the first trench, wherein the second protection layer has an opening therethrough; and an under bump metallurgy layer formed filling the opening of the hydrophilic first protection layer, exposed by the opening of the second protection layer.

2. The electronic device package structure as claimed in claim 1, wherein the first protection layer is hydrophilic polymer materials, parylene or perfluorinated silane, and the dielectric constant of the first protection layer is less than or equal to 3.

3. The electronic device package structure as claimed in claim 1, wherein the Young's modulus of the first protection layer is larger than or equal to 4.5 GPa.

4. The electronic device package structure as claimed in claim 1, wherein the first protection layer has a thickness of between 0.1 μm and 5 μm.

5. The electronic device package structure as claimed in claim 1, wherein the second protection layer comprises polyimide, epoxy, or ajinomoto build-up film or combinations thereof.

6. The electronic device package structure as claimed in claim 1, wherein the first trench extends through the chip.

7. The electronic device package structure as claimed in claim 1, further comprising:

an interconnection structure disposed in the dielectric layer, which is electrically connected to the chip;

a conductive pad disposed between the dielectric layer and the first protection layer, and electrically connected to the interconnection structure, wherein a top surface of the conductive pad is exposed from the openings of the first and the second protection layers;

a redistribution pattern conformably formed on the second protection layer and in the opening of the second protection layer, electrically connected to the conductive pad via the under bump metallurgy layer; and a conductive bump disposed on the redistribution pattern, which is electrically connected to the conductive pad.

8. The electronic device package structure as claimed in claim 1, further comprising a conductive pillar which is extended into the chip from the bottom surface of the chip, and which is electrically connected to the chip.

9. The electronic device package structure as claimed in claim 1, further comprising a bottom protection layer disposed between the dielectric layer and the first protection layer.

10. The electronic device package structure as claimed in claim 9, wherein the bottom protection layer comprises silicon nitride, silicon dioxide, polyimide, or benzocyclobutene (BCB) or combinations thereof.

11. The electronic device package structure as claimed in claim 1, further comprising a second trench formed through the dielectric layer, wherein the hydrophilic first protection layer covers the sidewalls of the second trench and the second protection layer fills the second trench.

12. The electronic device package structure as claimed in claim 1, wherein the chip, the dielectric layer, the first protection layer and the second protection layer construct an electronic device package semi-finished structure, wherein the electronic device package structure further comprises at least two electronic device package semi-finished structures, which are vertically laminated and electrically connected to each other.

13. An electronic device package structure, comprising:

a chip having an active surface and a bottom surface;

a dielectric layer disposed on the active surface of the chip;

a first trench formed through the dielectric layer;

a hydrophilic polymer first protection layer which covers the dielectric layer and sidewalls of the first trench, wherein the hydrophilic polymer first protection layer has an opening therethrough;

a second protection layer which covers the hydrophilic polymer first protection layer and fills the first trench, wherein the second protection layer has an opening therethrough; and an under bump metallurgy layer formed filling the opening of the hydrophilic polymer first protection layer, exposed by the opening of the second protection layer.

14. The electronic device package structure as claimed in claim 13, wherein the hydrophilic polymer first protection layer and the second protection layer are different materials.

15. The electronic device package structure as claimed in claim 14, wherein the second protection layer comprises polyimide, epoxy, or ajinomoto build-up film or combinations thereof.

16. The electronic device package structure as claimed in claim 13, wherein a dielectric constant of the hydrophilic polymer first protection layer is less than or equal to 3, and the hydrophilic polymer first protection layer has different materials than that of the dielectric layer.

17. The electronic device package structure as claimed in claim 16 wherein the hydrophilic polymer first protection layer comprises parylene or perfluorinated silane.

18. The electronic device package structure as claimed in claim 13, wherein the Young's modulus of the hydrophilic polymer first protection layer is larger than or equal to 4.5 GPa.

19. The electronic device package structure as claimed in claim 13, wherein the hydrophilic polymer first protection layer has a thickness of between 0.1 μm and 5 μm.

20. The electronic device package structure as claimed in claim 13, wherein the first trench extends through the dielectric layer to the active surface of the chip.

21. The electronic device package structure as claimed in claim 13, further comprising:

an interconnection structure disposed in the dielectric layer, which is electrically connected to the chip;

a conductive pad disposed between the dielectric layer and the hydrophilic polymer first protection layer, and electrically connected to the interconnection structure, wherein a top surface of the conductive pad is exposed from the openings of the first and the second protection layers;

a redistribution pattern conformably formed on the second protection layer and in the opening of the second protection layer electrically connected to the conductive pad via the under bump metallurgy layer;

a conductive bump disposed on the redistribution pattern, which is electrically connected to the conductive pad; and a conductive pillar extending into the chip from the bottom surface of the chip, which is electrically connected to the chip.

22. The electronic device package structure as claimed in claim 13, further comprising a bottom protection layer disposed between the dielectric layer and the hydrophilic polymer first protection layer.

23. The electronic device package structure as claimed in claim 22, wherein the bottom protection layer comprises silicon nitride, silicon dioxide, polyimide, or benzocyclobutene (BCB) or combinations thereof.

24. The electronic device package structure as claimed in claim 13, further comprising a second trench formed through the dielectric layer, wherein the hydrophilic first protection layer covers the sidewalls of the second trench and the second protection layer fills the second trench.

25. The electronic device package structure as claimed in claim 13, wherein the chip, the dielectric layer, and the hydrophilic polymer first protection layer construct an electronic device package semi-finished structure, wherein the electronic device package structure further comprises at least two electronic device package semi-finished structures, which are vertically laminated and electrically connected to each other.

* * * * *